United States Patent [19]

Lam

[11] Patent Number: 5,932,061

[45] Date of Patent: Aug. 3, 1999

[54] BOARD LEVEL DECAPSULATOR

[75] Inventor: Chung Lam, Fremont, Calif.

[73] Assignee: Sun Microsystems, Inc., Mountain View, Calif.

[21] Appl. No.: 08/740,380

[22] Filed: Oct. 29, 1996

[51] Int. Cl.$^6$ ........................................... C23F 1/02
[52] U.S. Cl. ............................................... 156/345
[58] Field of Search .............................. 156/345, 92

[56] References Cited

U.S. PATENT DOCUMENTS

| | | | |
|---|---|---|---|
| 4,822,441 | 4/1989 | Ohta et al. | 156/345 |
| 4,826,556 | 5/1989 | Kobayashi | 156/345 |
| 5,252,179 | 10/1993 | Ellerson et al. | 156/655 |
| 5,443,675 | 8/1995 | Wensink | 156/345 |
| 5,489,854 | 2/1996 | Buck et al. | 324/761 |
| 5,643,835 | 7/1997 | Chia et al. | 437/211 |
| 5,783,098 | 7/1998 | Martin et al. | 216/56 |
| 5,792,305 | 8/1998 | Winsemius et al. | 156/345 |

Primary Examiner—Bruce Breneman
Assistant Examiner—Alva C Powell
Attorney, Agent, or Firm—Blakely Sokoloff Taylor & Zafman

[57] ABSTRACT

A system that decapsulates an integrated circuit package while the package is mounted to a printed circuit board. The system includes a tray that supports a printed circuit board which has at least one integrated circuit package mounted to the board. Mounted to the tray is a clamp which clamps an injection head to the top of the package. The injection head is coupled to a source of decapsulation fluid which is sprayed onto the package. The decapsulation fluid is circulated across the package to remove the package material and expose the underlying integrated circuit. The injection head has a gasket that is pressed onto the package to prevent the fluid from leaking onto the printed circuit board. After the plastic is decapsulated the head can be removed from the package so that the integrated circuit can be tested while the circuit is connected to the printed circuit board.

8 Claims, 2 Drawing Sheets

BOARD LEVEL DECAPSULATOR

BACKGROUND OF THE INVENTION

1. Field of the Invention

The present invention relates to a system for decapsulating an integrated circuit package that is mounted to a printed circuit board.

2. Description of Related Art

Integrated circuits (ICs) typically contain a plurality of surface pads that are connected to the circuit of the IC. After fabrication the IC can be tested by placing probe pins of a device tester onto the surface pads. Integrated circuits are typically assembled into a package that is soldered to a printed circuit board. Some packages are constructed from a molded plastic material that encapsulates the integrated circuit. The integrated circuit becomes inaccessible to external test equipment after the plastic material is molded onto the IC. It is sometimes desirable to test the integrated circuit after the plastic is molded around the IC.

The integrated circuit can be exposed by decapsulating the plastic package within a device level decapsulation system (DLDS). The decapsulation system exposes a portion of the package to an etchant that removes the plastic material without attacking the underlying integrated circuit. The etchant is applied to the package until the surface pads of the IC are exposed to the ambient. Probe pins can then be placed onto the surface pads to test the integrated circuit.

It is sometimes desirable to test an integrated circuit after the IC is mounted to a printed circuit board. Debugging an individual integrated circuit after assembly to a printed circuit board presently requires the removal of the package from the board. The package is typically removed by applying heat to the assembly to reflow the solder joints. Reflowing and removing the package may damage the package leads, particularly packages which have fine high pitch lead counts. The reflow process also reduces the integrity of the board.

It is also desirable to test integrated circuits while the IC packages are still mounted to the printed circuit board. Final assembly tests are particularly desirable for high speed devices that are sensitive to the impedance of the circuit board. The device level decapsulation systems of the prior cannot expose the IC while the package is mounted to the printed circuit board. It is therefore desirable to provide a system that can decapsulate an integrated circuit package while the package is mounted to a printed circuit board.

SUMMARY OF THE INVENTION

The present invention is a system that decapsulates an integrated circuit package while the package is mounted to a printed circuit board. The system includes a tray that supports a printed circuit board which has at least one integrated circuit package mounted to the board. Mounted to the tray is a clamp which clamps an injection head to the top of the package. The injection head is coupled to a source of decapsulation fluid which is sprayed onto the package. The decapsulation fluid is circulated across the package to remove the package material and expose the underlying integrated circuit. The injection head has a gasket that is pressed onto the package to prevent the fluid from leaking onto the printed circuit board. After the plastic is decapsulated the head can be removed from the package so that the integrated circuit can be tested while the circuit is connected to the printed circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
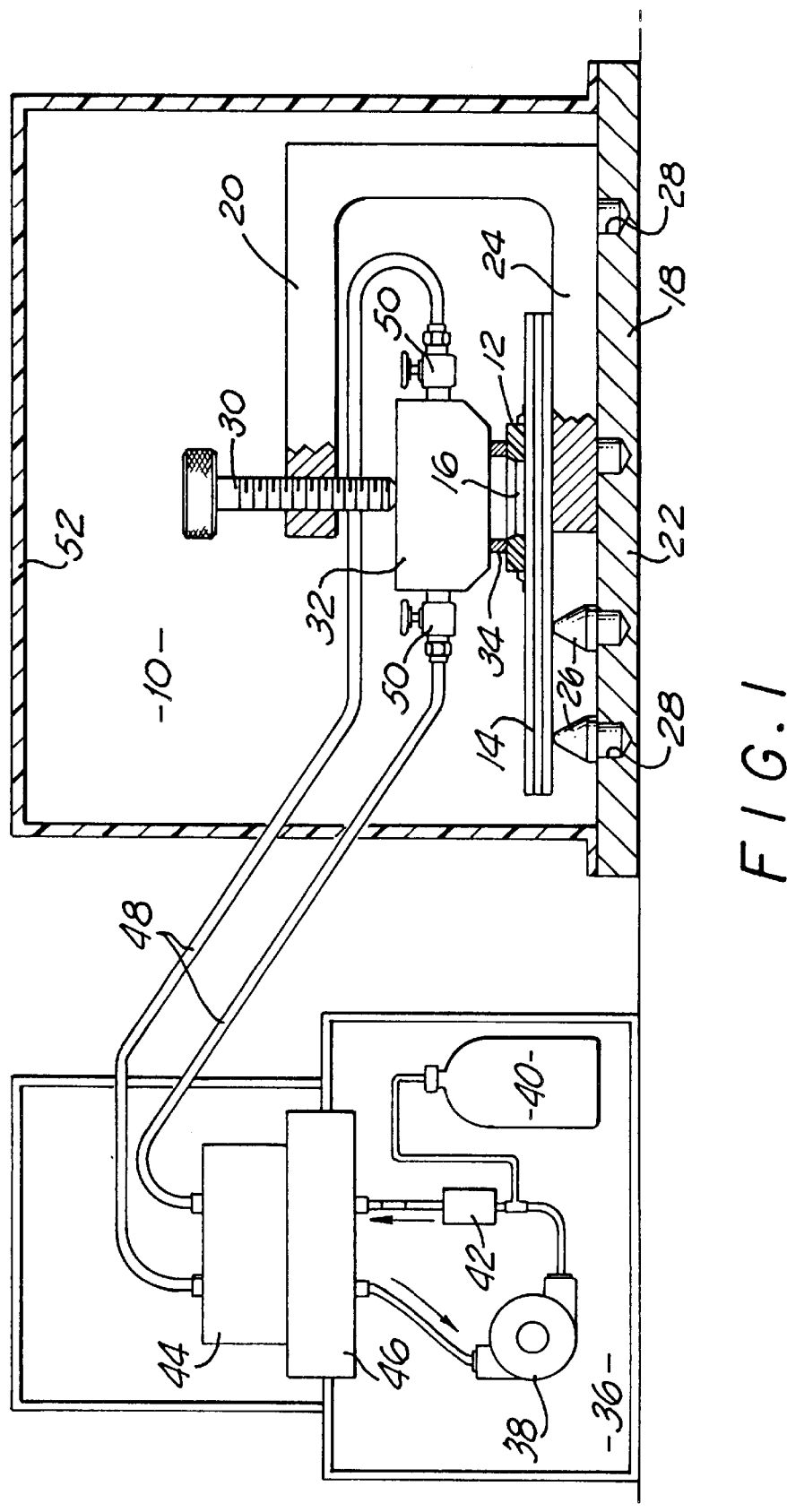
FIG. 1 is a schematic of a decapsulation system of the present invention.

Referring to the drawings more particularly by reference numbers, FIG. 1 shows a system 10 for decapsulating an integrated circuit package 12 that is mounted to a printed circuit board 14. The system 10 decapsulates the package 12 by removing a top portion of the package material to expose an underlying integrated circuit (IC) 16. Exposing the integrated circuit 16 allows the probe pins (not shown) of a device tester to be placed onto the IC 16 while the package 12 is still mounted to the board 14.

The system 10 includes a tray 18 that supports the printed circuit board 14. The system 10 contains a clamp 20 that is mounted to a substrate 22 of the tray 18. The clamp 20 has a clamp leg 24 which supports a portion of the printed circuit board 14. The printed circuit board 14 is also supported by a plurality of stubs 26 that are plugged into corresponding apertures 28 of the substrate 22. The top surface of the substrate 22 preferably has a plurality of apertures 28 that allow the stubs 26 to be plugged into any location within the tray 18. The plugs 26 can be moved within the tray 18 to compensate for printed circuit boards 14 that have different outer dimensions.

The clamp 20 has a screw 30 that presses an injection head 32 onto the top surface of the integrated circuit package 12. The injection head 32 sprays a decapsulation fluid onto the package 12. The decapsulation fluid removes the plastic material to expose the underlying integrated circuit 16. The head 32 has a gasket 34 that is pressed into the package 12. The gasket 34 is typically constructed from a material such as fluoric rubber that is inert to the decapsulation fluid. The gasket 34 prevents the decapsulation fluid from leaking onto the printed circuit board 14. The gasket 34 also allows the decapsulation fluid to be recaptured for further use. The dimensions and shape of the gasket 34 define the size and shape of the opening in the package 12.

The system 10 includes a decapsulation supply unit 36 which provides decapsulation fluid to the injection head 32. The unit 36 includes a pump 38 that circulates the fluid into the injection head 32 and across the package 12. The unit 36 also has a reservoir 40 and a valve 42 that controls the flow of fluid into the injection head 32. The valve 42 may be actuated by a controller (not shown) that can be programmed through a control panel. By way of example, the operator can set a start and stop time to decapsulate the package 12. The supply unit 36 may be a product sold by Nippon Scientific Co. Ltd. under the designation Plastic Mold Decapsulation System PA102. The Nippon product is typically used to decapsulate individual integrated circuit packages that are not mounted to a printed circuit board 14.

To utilize the existing Nippon product the system 10 has an extender 44 that is mounted to the nozzle interface 46 of the unit 36. The extender 44 allows the injection head 32 to be coupled to the unit nozzle by a pair of tubes 48 which carry the decapsulation fluid. The tubes 48 are typically constructed from TEFLON material which is inert to the decapsulation fluid. The system 10 preferably contains a pair of stop cock valves 50 that allow an operator to terminate the flow of fluid into the injection head 32. The tubes 48 are routed through a plastic shield 52 which encloses the injection head 32 and the circuit board 14.

Figure 2A:
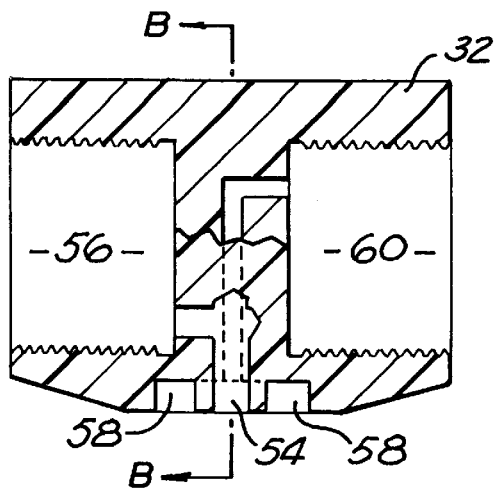
FIGS. 2a–b are cross-sectional views of an injection head of the system.
Figure 2B:
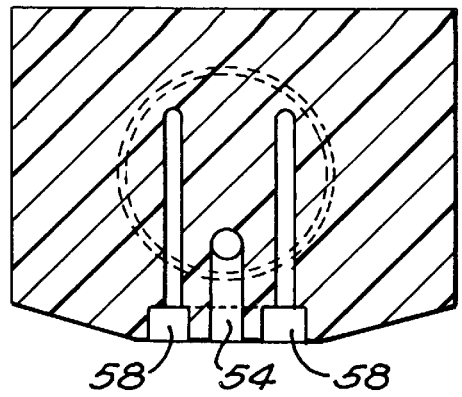

FIGS. 2*a–b* show a preferred embodiment of an injection head 32. The head 32 includes a nozzle 54 that is in fluid communication with an inlet port 56. The nozzle 54 sprays the decapsulation fluid onto the package 12. The head 32 also has a pair of return ports 58 coupled to an outlet port 60. The inlet 56 and outlet 60 ports are coupled to the extender 44 by tubes 48. The injection head 32 is preferably constructed from a material such as high density polyethylene (HDPE) that is inert to the decapsulation fluid.

Figure 3A:
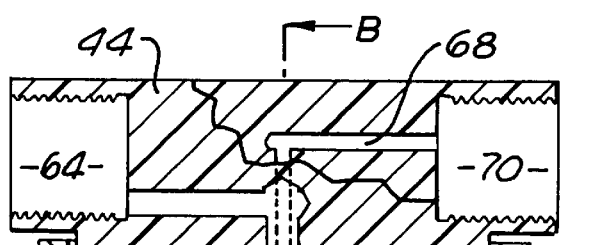
FIGS. 3a–b are cross-sectional views of an extender of the system.
Figure 3B:
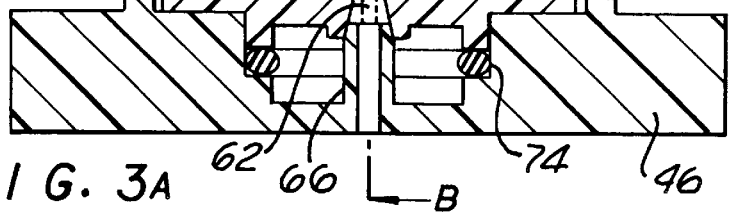

FIGS. 3*a–b* show a preferred embodiment of an extender 44 mounted to the nozzle interface 46 of the unit 36. The extender 44 has an intake port 62 that is in fluid communication with an outlet port 64, and aligned with a nozzle 66 of the unit 36. The intake port 62 and outlet port 64 direct the fluid into the injection head 32. The extender 44 also contains a pair of exhaust ports 68 that are in fluid communication with an inlet port 70, and aligned with a pair of return ports 72 of the unit 36. The exhaust 68 and inlet 70 ports direct the fluid from the injection head 32 to the unit 36. A seal 74 is preferably located between the nozzle intreface 46 and the extender 44. The extender 44 is preferably constructed from an HDPE material.

In operation, a printed circuit board 14 and accompanying integrated circuit package 12 are placed onto the clamp leg 24 and stubs 26 of the tray 18. The screw 30 is manipulated to provide a clearance for the insertion of the injection head 32 onto the package 12. The screw 30 is then turned to secure the head 32 to the package 12. The valves 42 and 50 are opened to allow the decapsulation fluid to flow onto the package 12.

The fluid circulates through the head 32 until the package 12 is decapsulated and the integrated circuit 16 is exposed. The valve 42 is then closed to terminate the flow of fluid. The intake valve is typically closed first to evacuate the fluid from the head 32. The screw 30 is turned so that the head 32 can be detached from the package 12. The board is then removed so that the integrated circuit 16 can be tested.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A system for decapsulating an integrated circuit package that is mounted to a first surface of a printed circuit board, the printed circuit board having a second surface located below the first surface of the printed circuit board, comprising:

a source of a decapsulation fluid;

a tray that supports the printed circuit board from a position below the second surface of the printed circuit board;

an injection head that is located adjacent to the integrated circuit package, said injection head has a nozzle located above the integrated circuit package and a return port that are coupled to said source of decapsulation fluid to introduce the decapsulation fluid to the integrated circuit package; and, a gasket that seals said injection head to the integrated circuit package.

2. The system as recited in claim 1, further comprising a clamp that clamps said injection head onto the integrated circuit package.

3. The system as recited in claim 1, wherein said source of decapsulation fluid includes an extender that is coupled to a nozzle that provides the decapsulation fluid.

4. The system as recited in claim 3, further comprising a pair of tubes that couple said extender to said injection head.

5. The system as recited in claim 4, further comprising a pair of valves that control a flow of the decapsulation fluid through said tubes.

6. The system as recited in claim 1, wherein said tray includes a stub that supports the printed circuit board and which is plugged into a substrate of said tray.

7. A system for decapsulating an integrated circuit package that is mounted to a first surface of a printed circuit board, the printed circuit board having a second surface located below the first surface of the printed circuit board, comprising:

a substrate;

a clamp that is mounted to said substrate, said clamp having a leg portion that supports the printed circuit board;

a stub that is plugged into said substrate and which supports the printed circuit board from a position below the second surface of the printed circuit board;

a decapsulation fluid unit which has a nozzle that provides a decapsulation fluid, and a return port that receives the decapsulation fluid;

an extender that has an intake port that is in fluid communication with an outlet port of said extender and said nozzle of said decapsulation fluid unit, and an exhaust port that is in fluid communication with an inlet port of said extender and said return port of said decapsulation fluid unit;

an injection head that is clamped to the integrated circuit package by said clamp, said injection head has a nozzle located above the integrated circuit package that is in fluid communication with an inlet port of said injection head, and a return port that is in fluid communication with an outlet port of said injection head;

a first tube that couples said outlet port of said extender with said inlet port of said injection head;

a second tube that couples said inlet port of said extender with said outlet port of said injection head; and, a gasket that seals said injection head to the integrated circuit package.

8. The system as recited in claim 7, further comprising a pair of valves that control a flow of the decapsulation fluid through said tubes.

* * * * *